United States Patent [19]
Sadigh-Behzadi

[11] Patent Number: 5,509,204
[45] Date of Patent: Apr. 23, 1996

[54] METHOD OF FORMING A FLAT FLEXIBLE JUMPER

[76] Inventor: Amir-Akbar Sadigh-Behzadi, 14690 Lanark St., Van Nuys, Calif. 91402

[21] Appl. No.: 143,174

[22] Filed: Oct. 25, 1993

[51] Int. Cl.$^6$ .................................................. H01R 43/00
[52] U.S. Cl. .................. 29/883; 174/117 F; 174/117 FF
[58] Field of Search .......................... 174/117 F, 117 FF; 29/825, 883, 874, 883

[56] References Cited

U.S. PATENT DOCUMENTS

| | | | |
|---|---|---|---|
| 3,601,755 | 8/1971 | Shiells et al. | |
| 3,703,604 | 11/1972 | Henschen et al. | |
| 3,764,727 | 10/1973 | Balde | 174/117 FF X |
| 3,914,531 | 10/1975 | Zell et al. | 174/117 F X |
| 4,085,502 | 4/1978 | Ostman et al. | 174/117 FF X |
| 4,107,836 | 8/1978 | Roberts | |
| 4,357,750 | 11/1982 | Ostman | 174/117 F X |
| 4,879,433 | 11/1989 | Gillett et al. | 174/117 F |
| 5,274,195 | 12/1993 | Murphy et al. | 174/117 FF |

FOREIGN PATENT DOCUMENTS

| | | | |
|---|---|---|---|
| 2709129 | 8/1978 | Germany | 174/117 F |

OTHER PUBLICATIONS

"Deci-Flex Jumpers"; Machine Design; Jan. 10, 1991; p. 54.
"Sculptured Circuits and Jumpers"; Advanced Circuit Technology Data Sheet; Catalog SP-479; 1980.
"Flexstrip Jumpers"; Thomas & Betts High Performance Flexible Interconnect Systems Catalog; May 1987; pp. 5-8.
"Ultra-Flex parallel conductors"; Amphenol Corporation Spectra-Strip Catalog; Oct. 1984; p. 6.
"Spectra-Strip Flat Conductor"; Amphenol Corporation Spectra-Strip Catalog; Oct. 1984; p. 25.

Primary Examiner—Carl J. Arbes
Attorney, Agent, or Firm—Knobbe, Martens, Olson & Bear

[57] ABSTRACT

A flat flexible jumper is made from a preformed strip of conductive material which is cut to the desired jumper configuration and covered by a layer of insulation. The preformed strip is formed of a series of raised zones and flat zones. A stamping process is executed on the preformed strip utilizing a series of cutting dies to form the desired jumper configuration of the preformed conductive strip. A first die cuts away the material in the flat zone of the preformed strip leaving the raised zone remaining. A second die cuts away a portion of the flat zone and a portion of the raised zone providing a first transition region between the raised zone and the flat zone. A third die cuts away the material in the raised zone of the preformed conductor strip leaving the flat zone remaining. A fourth die cuts away a portion of the raised zone and a portion of the flat zone providing the second transition region between the flat zone and the raised zone. After the cutting process, the jumper is covered in insulation to prevent undesired contact between each of the conductors of the jumper. Any number of conventional insulation application methods, such as extruding insulation around the jumper or laminating two layers of insulation around the central portion of the jumper, can be used.

3 Claims, 10 Drawing Sheets

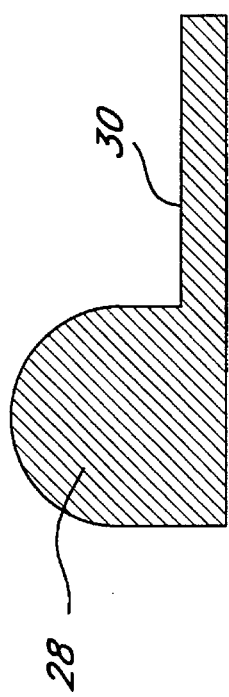
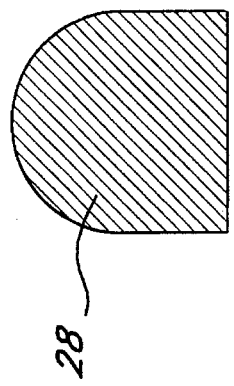
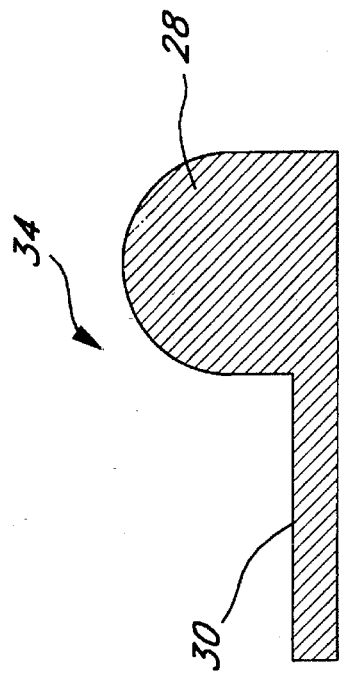
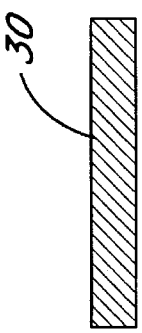
FIG. 9a
FIG. 9b
FIG. 9c
FIG. 9d

METHOD OF FORMING A FLAT FLEXIBLE JUMPER

BACKGROUND OF THE INVENTION

1. Field of the Invention

The present invention relates to flat flexible electrical jumpers comprising a plurality of flat connectors contained within an insulation material. More specifically, the invention relates to an improved method of manufacture to enable several flat flexible jumper configurations to be manufactured without requiring changes in the tooling.

2. Description of the Related Art

In the past, most flexible jumpers comprised strands of round wires housed in a rounded shell of insulation. Once the desirability for flat flexible jumpers increased in the art, several companies developed various designs and manufacturing methods for producing a flat flexible cable. Generally, flat flexible cables of the prior art comprise a connection portion on each end of the cable shaped to mate with their respective mating connector and a flat conduction portion linking each end of the connector.

U.S. Pat. No. 3,601,755, issued to Shiells, etal. and assigned to Thomas and Betts, discloses a flexible flat jumper strip. The jumper strip is formed by aligning a series of round wires in a row and rolling down a central portion of each wire to form the thin flat cross section of the conduction portion. This process results in a jumper with two identically sized and shaped round connection portions on each end of the jumper and a flat central conduction portion. Since the rolling of the round wires creates the flat conduction portion, the dimensions of the flat conduction zone result from the cross-sectional area of the round zone.

For example, creating a jumper using the above method with a connection portion having a 0.02 inch diameter and a flat conduction portion of 0.004 inches thick would result in the following other parameters. Since the desired jumper has a round connection portion of a 0.020 inch diameter, the cross-sectional area of the connection portion by definition is 0.000314 square inches. Following the above procedure, the central portion of the wire is rolled down to a rectangular cross-section with a 0.004 inch thickness. After rolling, the wire will necessarily have an approximate width of 0.080 to maintain the original 0.000314 square inch cross-sectional area of the round connection portion. If each wire in the flat conduction portion touched each other, then the minimum distance between the center of each flat wire conductor would be 0.08 inches. Since it is not desirable to let the wires touch each other, a thin layer of insulation is placed between each wire. The minimum distance between the center point of each round connection end of the wire must necessarily be equivalent to the minimum spacing between the flat section of each wire. In the above example, even without the placement of insulation between each wire, the distance between each round connection end of the jumper wires, also referred to as the pitch, is at least 0.08 inches apart. Therefore, the minimum pitch of a connector with a round wire of 0.02 inches in diameter and a 0.004 inch thickness in the central portion is 0.08 inches. Using the above method, it would be impossible to produce a conductor with wires spaced at a pitch of 0.050 inches, having a round zone of 0.02 inches in diameter and a thickness of 0.004 inches. Therefore, as illustrated by the above example, it is undesirable to have the cross sectional area of the round connection portion, i.e., the diameter of the round zone, directly related to the cross sectional area of the flat zone as it limits the numbers of possible jumper configurations.

In addition, the rolling process is often inconsistently applied depending on where and if the roller contacts each wire. The inconsistent application of the coining or rolling operation causes slight variations in the thickness of the flat zone. Variations in the thickness of the flat zone cause variations in the flexibility life of the jumper. Inconsistencies in the flexibility and life of the jumper are undesirable, as they can cause premature and unexpected failure to result in the jumper.

Further, the coining operation changes the original mechanical properties of the wire, such as tensile strength, hardness, elongation and flexibility. If a preplated wire is used in a jumper that is formed by rolling, the preplated wire will be work-hardened and cannot be annealed. This alteration of the mechanical properties of the wire is undesirable, since a work-hardened metal is more susceptible to fatigue. Therefore, there exists a need in the art for an improved manufacturing process to produce flexible jumpers without altering the mechanical properties of the wires which form the jumpers.

Another method of the prior art, utilizes a flat strip of conductive material of a given thickness which is stamped at various locations to form sections of thinner widths. Using this method, if it is desirable to obtain a cross-sectional area that is thinner than the original thickness, the strips of metal are coined down, and the material in excess of the desired width is removed.

For example, if the thickness of the strip is 0.020 inches, the maximum thickness of the connection zone is 0.020 inches thick. If a flat zone is 0.010 inches thick, the flat zone is coined down to approximately 0.010 inches and results in a 0.040 inch width, thus the desired reduced thickness of 0.010 inches is achieved. However, if the flat zone having a width of 0.040 inches is too large, a cutting die is used to remove the material in excess of the desired strip width. If an even thinner flat zone is desired, another coining operation can be used to reduce the thickness to 0.004 inches. This coining operation will necessarily increase the width to 0.060 inches. If a reduced width is desired, a cutting die will be used to remove any material in excess of the desired pitch.

This method requires a number of individually sized dies to cut back the material to the desired strip width. Additionally, an additional die is required to cut each length of the connector. The increased tooling costs that are required to manufacture each of the individual dies make this manufacturing method very costly.

Further, the multiple coining and cutting steps workharden the material with each process that is performed on the wire. Therefore, the undesired alteration of the mechanical properties of the metal is more severe in this method of manufacturing than in the previous method.

Finally, U.S. Pat. No. 4,107,836, issued to Roberts and assigned to Advanced Circuit Technology discloses a flexible flat jumper strip which is made by chemical etching. In order to form a jumper by the chemical etching process, a strip of conductive metal of a thickness equivalent to the largest thickness that is desired for the jumper is formed. A masking pattern is laid over the length of the jumper material, and those portions which are to remain at the current thickness of the material are indicated on the pattern. The pattern of the blocked off areas is formed on an etching mask by a conventional photolithography process. A traditional chemical etching procedure is then performed using the etching masks to remove the material in those areas which are not blocked off by the chemical etching mask thereby achieving the desired width in these areas.

This process enables custom jumpers to be made as easily as standard jumpers. However, a separate etching mask must be made for each configuration, and the costs associated with making an etching mask are extremely high. Further, there are several factors in the chemical masking process that limit the amount of material that can be etched off in a single procedure. Therefore, there is a limit to the thickness variation between the central flat portion and the connection portion. The main disadvantage of this jumper manufacturing method is its high costs.

Therefore, there exists a need in the prior art for a thin, flexible jumper cable that can be manufactured in several different configurations without requiring the high tooling costs associated with the prior art jumper manufacturing methods and without changing the mechanical properties of the metal which forms the jumper.

SUMMARY OF THE INVENTION

The present invention comprises a flat flexible electrical jumper cable made from a preformed strip of conductive material which is cut to the desired jumper configuration and covered by a layer of insulation. Additionally, the invention relates to an improved method of manufacture to enable a variety of flexible jumper cable configurations to be constructed without requiring expensive changes to be made to form different length jumpers. Preferably, the flat flexible jumper comprises three distinct zones: (1) a raised connection zone, (2) a flat flexible zone and (3) a transition zone between the raised connection zone and the flat flexible zone.

The preformed strip preferably comprises two distinct cross-sectional areas which alternate with each other across the width of the strip. The first cross sectional area of the strip corresponds to the cross-sectional area of the raised zone of the flat flexible jumper. The second cross-sectional area of the strip corresponds to the cross-sectional area of the flat zone of the jumper. The number of raised and flat cross-sectional areas which are constructed on the preformed strip is equivalent to the number of desired connection points.

In a preferred embodiment, the raised zone can have any number of shapes in cross-section. For example, if the jumper is to be soldered to a printed circuit board, the raised zone can be formed as a solder tail. Additionally, each end of the jumper can have a raised zone of a different shape, if desired. As will be obvious to one of skill in the art, the shape of the raised zone can be of any of a variety of shapes depending upon the shape of the component into which the jumper is to be mated.

In order to form the flat flexible cable from the preformed conductive strip, a stamping process is executed on the strip to remove unwanted portions of the strip. The stamping process is performed utilizing one of four dies depending upon the desired region which is to be cut. A first die cuts away the material in the flat zone of the preformed strip leaving the raised zone remaining. A second die cuts away a portion of the flat zone and a portion of the raised zone providing a transition region between the raised zone and the flat zone. A third die cuts away the material in the raised zone of the preformed conductor strip leaving the flat zone remaining. A fourth die cuts away a portion of the raised zone and a portion of the flat zone providing the transition region between the flat zone and the raised zone. The incremental area which is cut with each die can be changed by altering the length of the die.

The jumper is formed by executing a series of stamping steps on the preformed strip to construct the raised, flat and transition zones of the jumper. Since a die of a given incremental area is used, the length of each of the zones must be divisible by the incremental length of their respective dies.

A preferred method of forming the electrical jumper cable comprises the following steps. First, a preformed conductive strip is formed, wherein the conductive strip comprises alternating conducting bands having first and second cross-sectional areas. From a first portion of the preformed conductive strip, all of the conducting bands having the first cross-sectional area are selectively removed. From a second portion of the preformed conductive strip, a portion of all of the conducting bands having the first cross-sectional area are removed and simultaneously a portion of all of the conducting bands having the second cross-sectional area are removed. From a third portion of the preformed conductive strip, all of the conducting bands having the second cross-sectional area are selectively removed. From a fourth portion of the preformed conductive strip, a portion of all of the conducting bands having the first cross-sectional area are removed and simultaneously a portion of all of the conducting bands having the second cross-sectional area are removed. From a fifth portion of the preformed conductive strip, all of the conducting bands having the first cross-sectional area are selectively removed.

After the cutting process, the jumper is covered by insulation to prevent undesired contact between each of the conductors of the jumper. Any number of conventional insulation application methods may be used, such as extruding or laminating the insulation. In a preferred embodiment of the present invention, the lamination process is utilized to attach the insulation to the wire conductors.

Advantageously, the coining or stamping process which is utilized to manufacture the jumper of the present invention removes the unwanted material from the preformed conductive strip for each area of the jumper without changing the mechanical properties of the material, such as the tensile strength, hardness, elongation and flexibility of the material of the jumper. Further, the preferred manufacturing process enables a jumper of any number of different parameters to be formed, since the parameters of the raised zone and the flat zone of the jumper are independent of each other.

BRIEF DESCRIPTION OF THE DRAWINGS

FIG. 9a is a cross-sectional view of the raised zone of the preformed conductive strip after cutting as taken though the line 9a illustrated in FIG. 8.

FIG. 9b is a cross-sectional view of the first transition region of the preformed conductive strip after cutting as taken though the line 9b illustrated in FIG. 8.

FIG. 9c is a cross-sectional view of the flat zone of the preformed conductive strip after cutting as taken though the line 9c illustrated in FIG. 8.

FIG. 9d is a cross-sectional view of the second transition region of the preformed conductive strip after cutting as taken though the line 9d illustrated in FIG. 8.

DETAILED DESCRIPTION OF THE PREFERRED EMBODIMENTS

Figure 1:
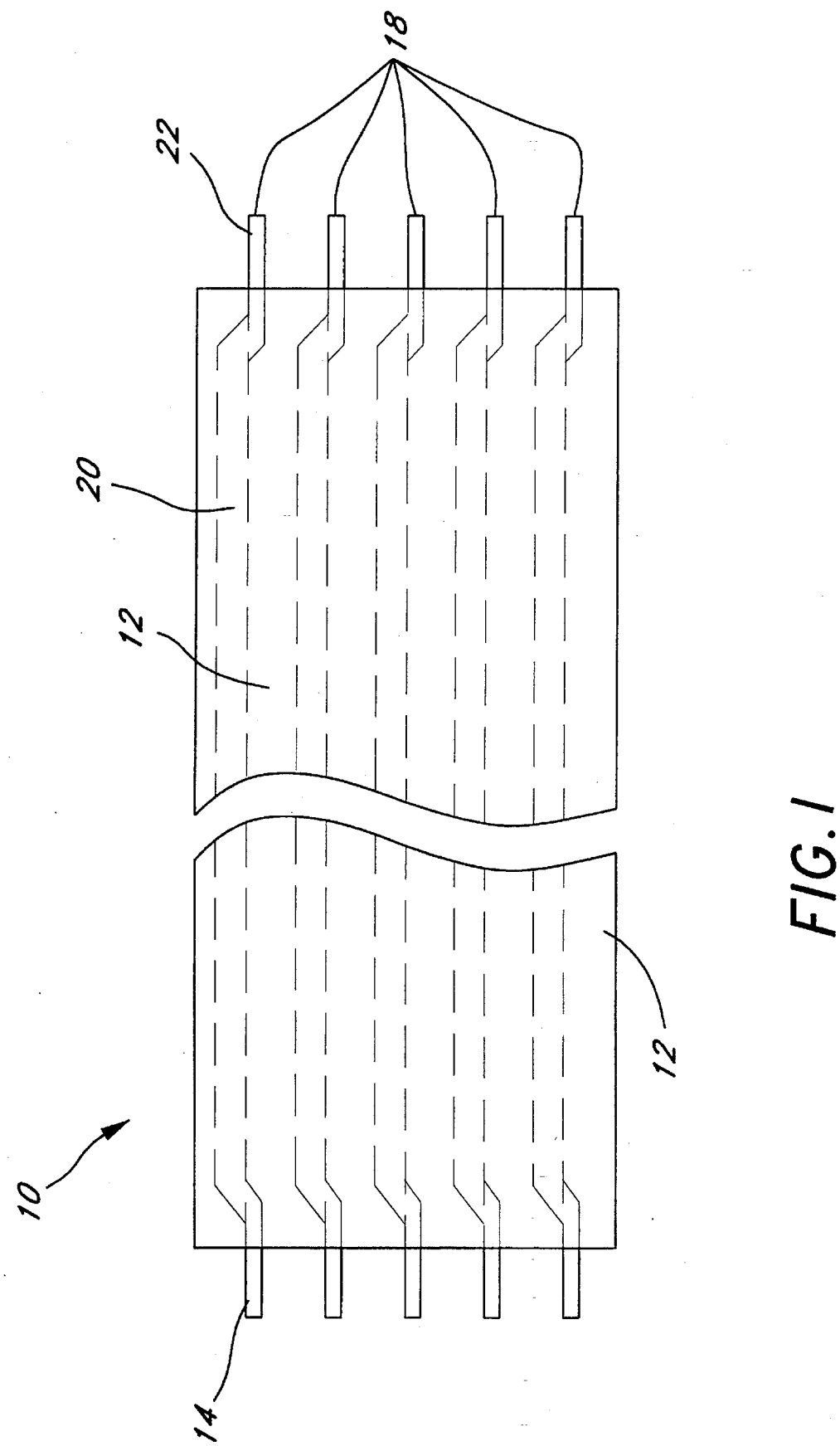
FIG. 1 is a top plan view of a preferred embodiment of the flat flexible jumper of the present invention.
Figure 2:
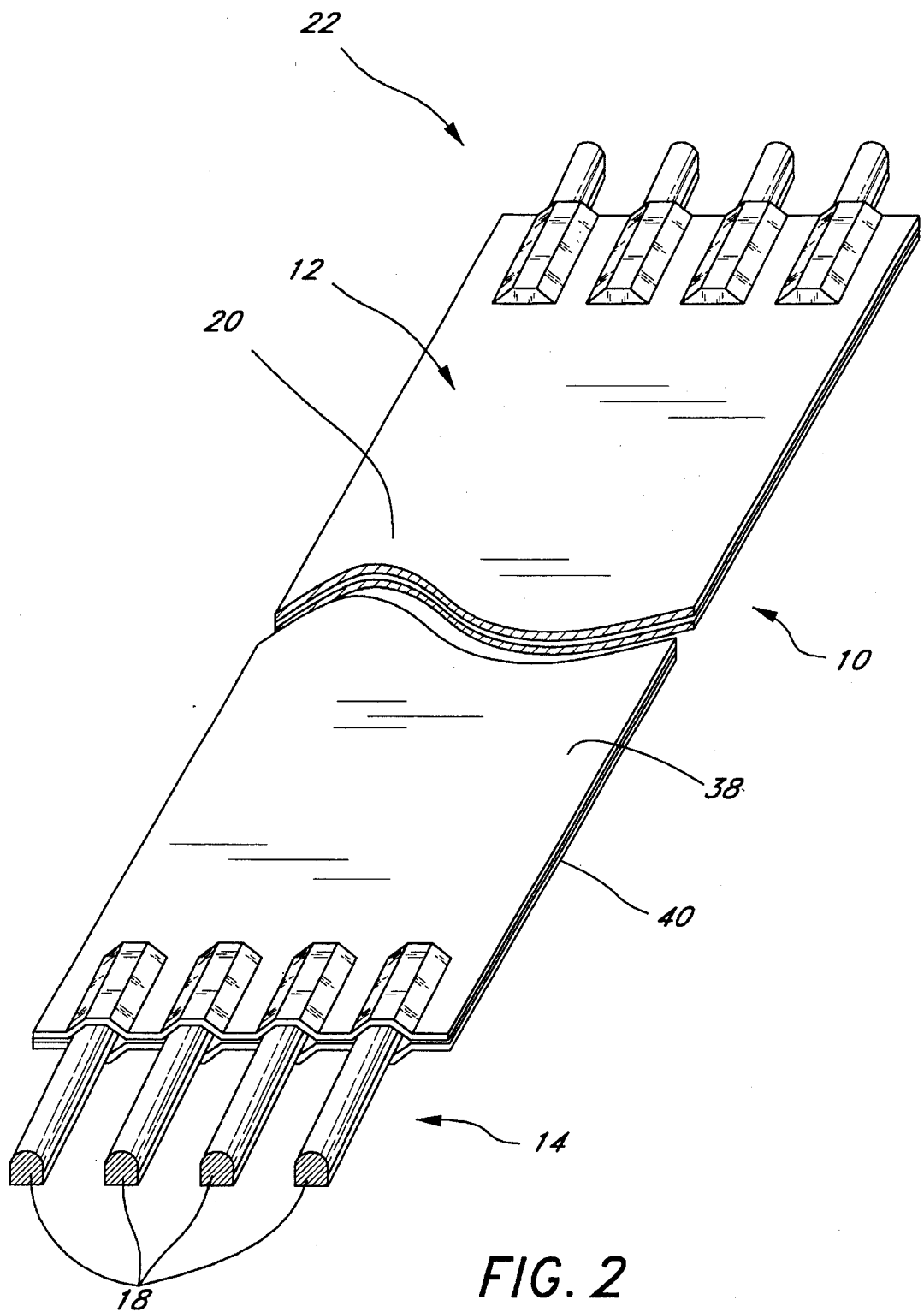
FIG. 2 is a perspective view of a preferred embodiment of the flat flexible jumper of the present invention.

The preferred embodiment of the present invention, as illustrated in FIGS. 1 and 2, comprises a flat flexible electrical jumper cable 10 made from a preformed strip of conductors (FIG. 3) that is stamped to achieve the desired configuration and is covered by a layer of insulation 12. Preferably, the jumper cable 10 comprises three distinct areas (1) a proximal termination end 14 which terminates in a plurality of connection points 18, (2) a flat flexible central zone 20 and (3) a distal termination end 22 which terminates in a plurality of connection points 18.

Figure 3:
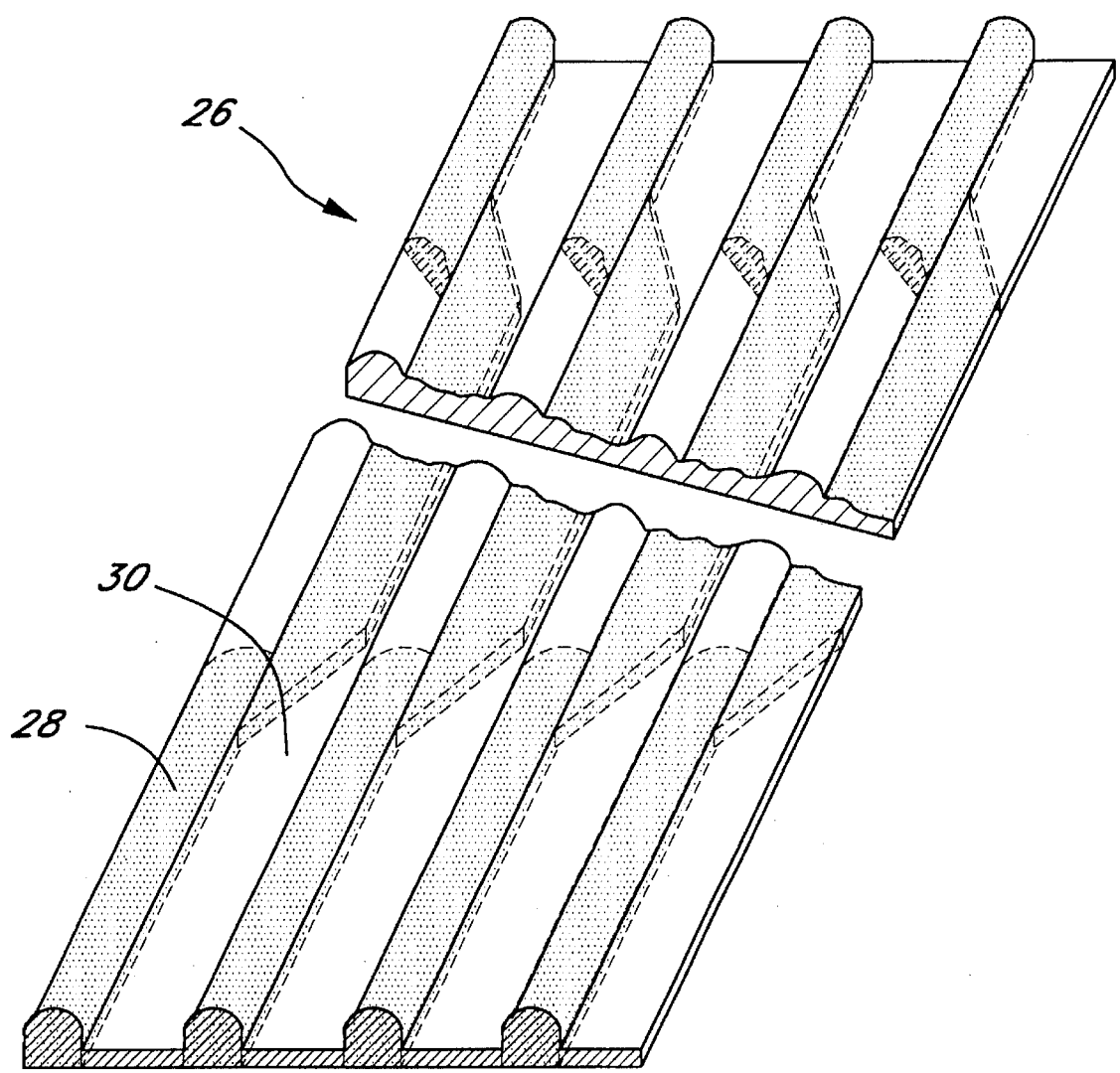
FIG. 3 is a perspective view of a preferred embodiment of the preformed conductive strip with a raised zone having a semi-circular cross-sectional area.

FIG. 3 illustrates a preformed conductor strip 26 from which the jumper 10 is manufactured utilizing the preferred manufacturing process. The preformed conductive strip 26 preferably comprises alternating conducting bands having first and second cross-sectional areas. The preformed conductor strip 26 is preferably formed from a continuous strip of conductive metal. Preferably, the metal that is chosen to form the strip has good electrical conduction properties. One example of a metal with the desired electrical properties is CDA-102 copper alloy.

The preformed conductive strip 26, illustrated in FIG. 3, preferably comprises alternating conducting bands having first and second cross-sectional areas. A first cross-sectional area 28 of the preformed strip 26, referred to as the raised zone, has the identical dimensions as the proximal and distal termination ends 14, 22 of the flat flexible jumper 10. A second cross-sectional area 30 of the strip 26, referred to as the flat zone, has the identical dimensions of the flat flexible central zone 20 of the flat flexible jumper 10. FIG. 3 also illustrates, utilizing phantom lines and shading, one configuration of the jumper 10 which is formed from the continuous strip 26.

The number of raised zones 28 and the flat zones 28 which are formed across the width of the preformed strip 26 are each equivalent to the desired number of connection points 18, i.e., termination points, that are desired on each of the proximal and distal ends 14, 22 of the flat flexible jumper 10. If twenty connection points 18 are desired, then twenty raised zones 28 and twenty flat zones 30 are formed on the conductive strip 26. As indicated above and illustrated in FIG. 3, the raised zones 28 and flat zones 30 are constructed such that they alternate along the width of the conductive strip 26.

The raised zone 28 of the conductive strip 26 provides the desired rigidity of the resultant jumper 10 (FIG. 1) whereas the flat zone 30 of the conductive strip 28 provides the desired flexibility of the jumper 10. In order to provide the thinnest profile possible of the jumper 10, the flat zone 30 of the conductive strip 26 is preferably thin enough in cross-section to enable sufficient flexibility. However, the flat zone 30 of the conductive strip 26 must be thick enough to carry the weight to be handled by the resultant jumper 10.

The preformed strip 26 can be constructed by any number of conventional machining techniques known to one of skill in the art, such as milling, skiving, e-beam welding, stamp cold rolling extruding, or chemical etching. Due to cost factors and process limitations associated with the other processes, milling is the preferred method of manufacturing the preformed conductive strip 26. Additionally, milling enables almost any length of the preformed continuous strip 26 to be manufactured. However, as will be apparent to one of skill in the art, some configurations may warrant the construction of the preformed strip 26 by one of the other types of manufacturing methods listed above.

The construction of the preformed. strip 26 by milling is preferably performed as follows. First, a conductive strip 6 of the desired thickness is selected. The thickness of the conductive strip 26is equivalent to the thickness of the desired raised zone 28. Secondly, the width of the conductive strip 26 is selected. The width of the conductive strip 26 is determined by multiplying the desired width of each raised zone 28 by the desired number of connection points 18 and adding to that number the width of the each flat zone 30 multiplied by the number of connection points 8.

Figure 4:
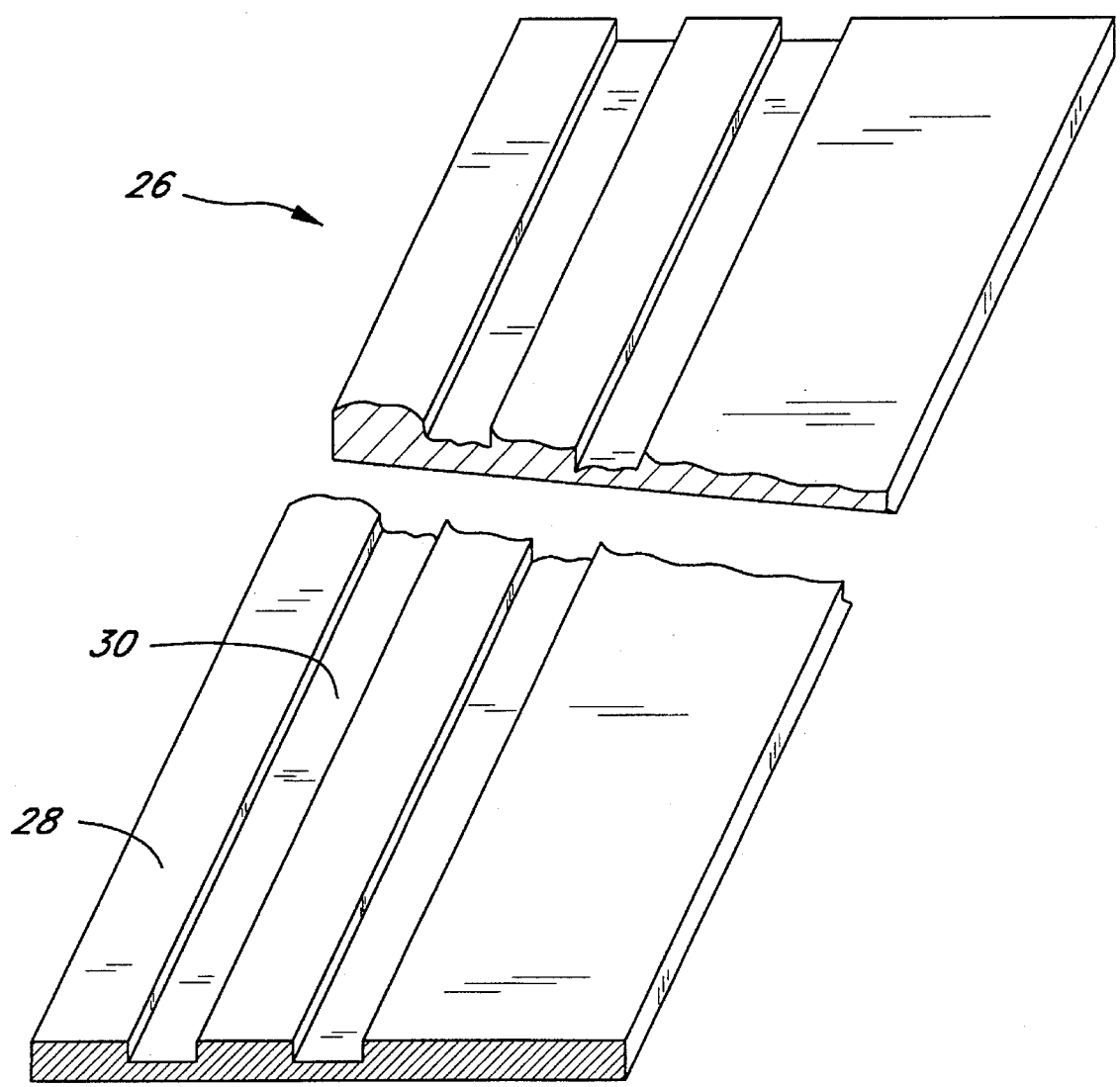
FIG. 4 is a perspective view of a partially completed preformed conductive strip with a raised zone having a rectangular cross-sectional area.

The milling process is performed along the length of the conductive strip 26 to remove the excess material from the strip 26 to form the reduced thickness of the flat zone 30. As illustrated in FIG. 4, the milling process is performed on alternating areas of the conductive strip 26 leaving the width of each raised zone 28 untouched and milling down the thickness of the strip 26 to form the alternate widths of the flat zone 30.

As indicated above, dimensions of the raised zone 28 and the flat zone 30 of the preformed conductor strip 26 are constructed by the selection of the material thickness of the preformed conductor strip 26, the amount of material removed from the strip 26 by the milling process and by the number of desired connection points 18. Advantageously, the dimensions of the raised zone 28 and the flat zone 30 of the flexible conductor strip 26 are independent of each other, since the milling process can be adjusted to provide any dimension for the flat zone 30 regardless of the dimensions of the raised zone 28. By removing the relationship between the dimensions of the raised zone 28 and the flat zone 30, a greater range of dimensions is available for both the round zone 28 and flat zone 30 of the preformed strip 26. A greater range of possible dimensions of the round zone 28 and flat zone 30 of the preformed strip 26, necessarily results in a greater range of possible dimensions for the connection ends 14, 22 and for the flat flexible central zone 20 of the flat flexible jumper 10. The greater variety of dimensions available for the connection ends 14, 22 and for the flat flexible central zone 20 of the flat flexible jumper cable 10 is a great advantage over the jumper cables of the prior art, some of which were limited to relational values between their connection end and flat central portions.

Figure 5:
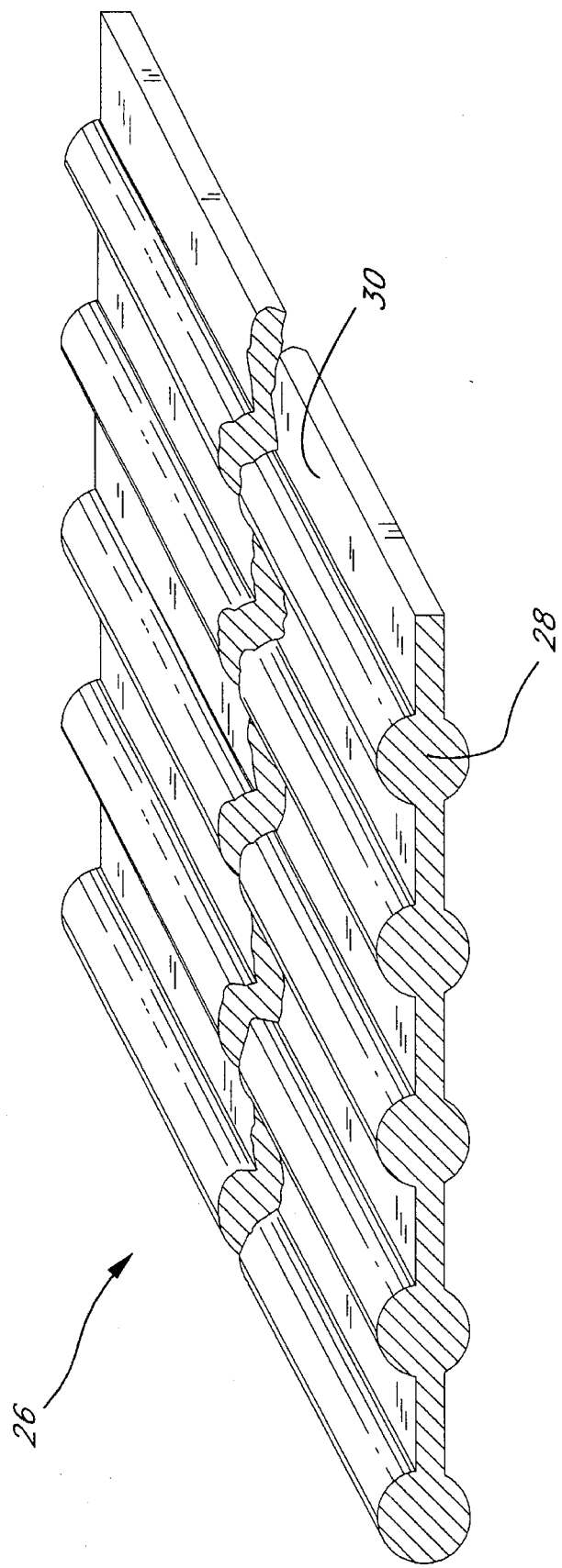
FIG. 5 is a perspective view of the preformed conductive strip with a raised zone having a circular cross-sectional area.
Figure 6:
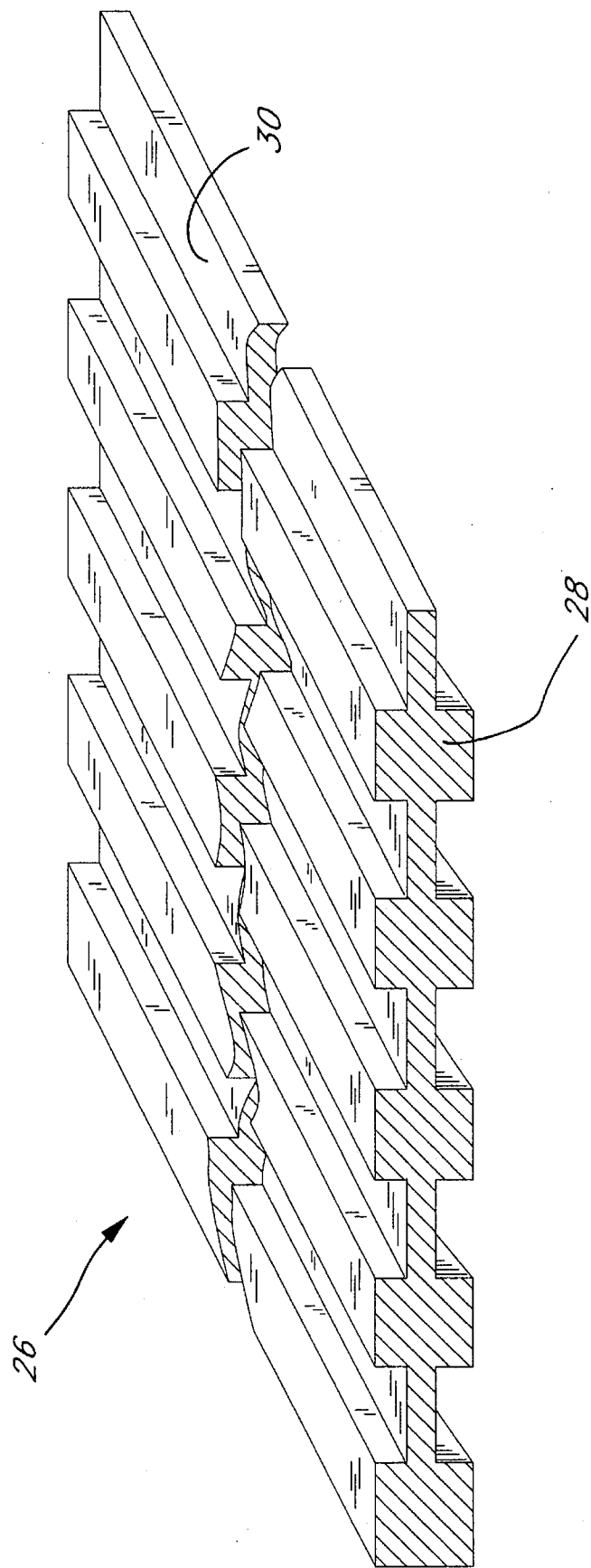
FIG. 6 is a perspective view of the preformed conductive strip with a raised zone having a square cross-sectional area.
Figure 7:
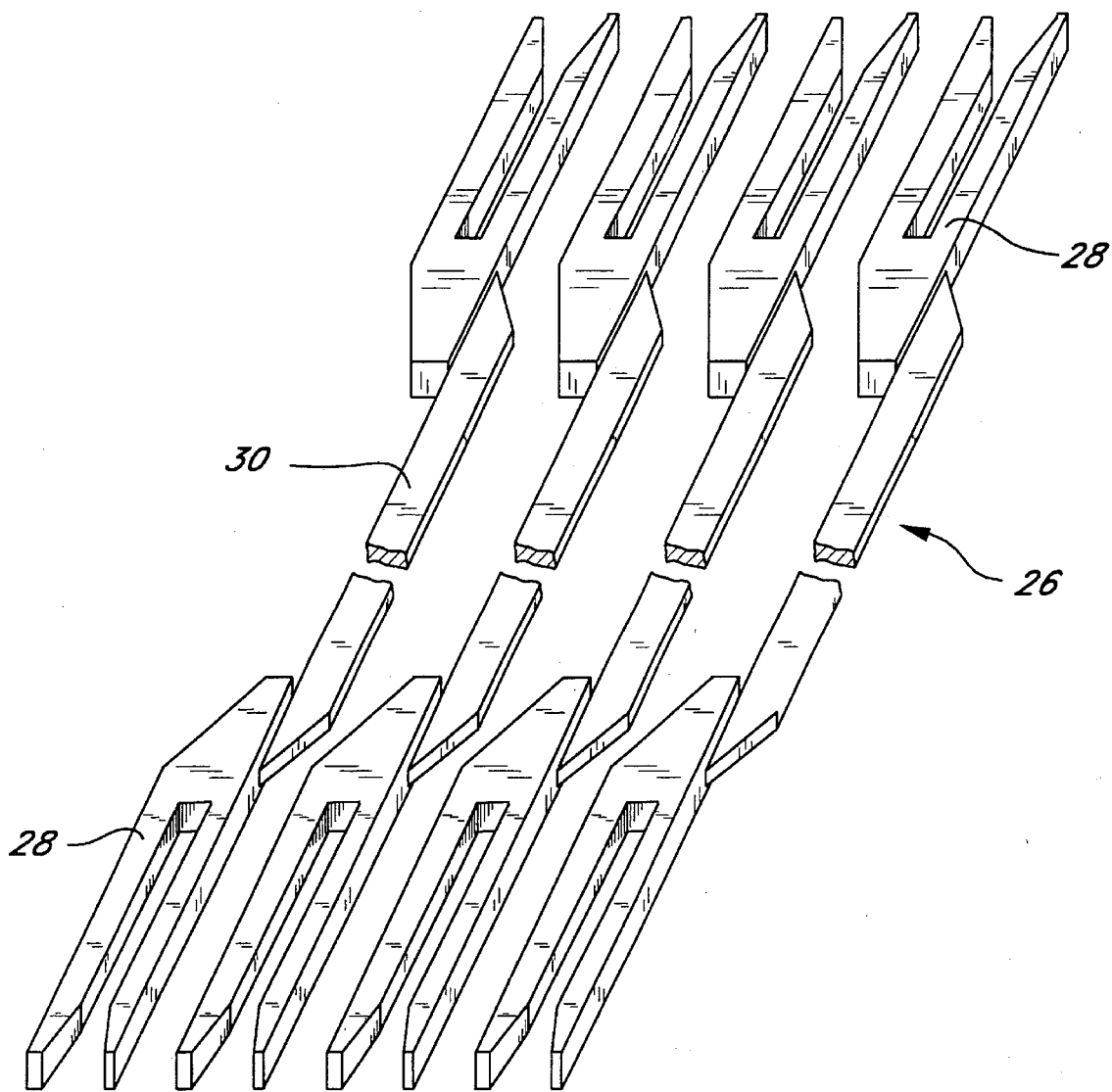
FIG. 7 is a perspective view of the preformed conductive strip with a raised zone having a socket contact shaped cross-sectional area.

The raised zone of the conductive strip 26 can have any number of shapes in cross-section. For example, if the jumper is to be soldered to a printed circuit board, the raised zone can be formed as a solder tail. If the jumper is to be inserted into a socket contact, the raised zone can be formed such that the cross-sectional area is circular, i.e., a pin contact, for insertion into a female socket. FIG. 5 illustrates an exemplary embodiment of the raised zone 28 of the conductive strip 26 shaped as a round pin contact. Additionally, FIG. 6 illustrates an exemplary embodiment of the a raised zone 28 of the conductive strip 26 formed with a square cross-sectional area. If the jumper is to be inserted around a pin contact, the raised zone of the jumper can be hollow in the center to form a female socket contact to mate with a male pin contact. FIG. 7 illustrates an exemplary embodiment of the raised zone 28 of the conductive strip 26 shaped as a socket contact having already been cut by the manufacturing process which will be described in more below. As will be obvious to one of skill in the art, the shape of the raised zone can be any of a variety of shapes depending upon the shape of the component into which the jumper is mated. In order to achieve the variety of shapes of the raised zone 28, the milling process, or other processes used to construct the continuous preformed strip, is simply altered to result in the formation of the desired cross-sectional shape of the raised zone 28.

In order to form the flat flexible jumper 10 from the preformed conductive strip 26, a stamping process is executed on the continuous preformed strip 26 to remove unwanted portions of the conductive strip 26. The stamping process is formed utilizing one of four dies depending upon the desired region which is to be cut. A first die cuts away a portion of the material in the flat zone 30 of the preformed strip 26 leaving the raised zone 28 remaining. A second die cuts away a portion of the flat zone 30 and a portion of the raised zone 28 providing a transition region 32 between the raised zone 28 and the flat zone 30. A third die cuts away a portion material in the raised zone 28 of the preformed conductor strip 26 leaving the flat zone 30 remaining. A fourth die cuts away a portion of the raised zone 28 and a portion of the flat zone 30 providing the transition region 32 between the flat zone 30 and the raised zone 28. The incremental area which is cut with each die is defined by the length of the die. Since a die of a given incremental length is used, the length of each of the zones must be divisible by the incremental length of their respective dies. In order to form the flat flexible central zone 20 of the jumper 10 from the preformed conductive strip 26, the third die which contains the cut out to remove the raised zone and to keep the flat zone is repeatedly stamped a number of times as the conductive strip 26 is moved along below the die.

Figure 8:
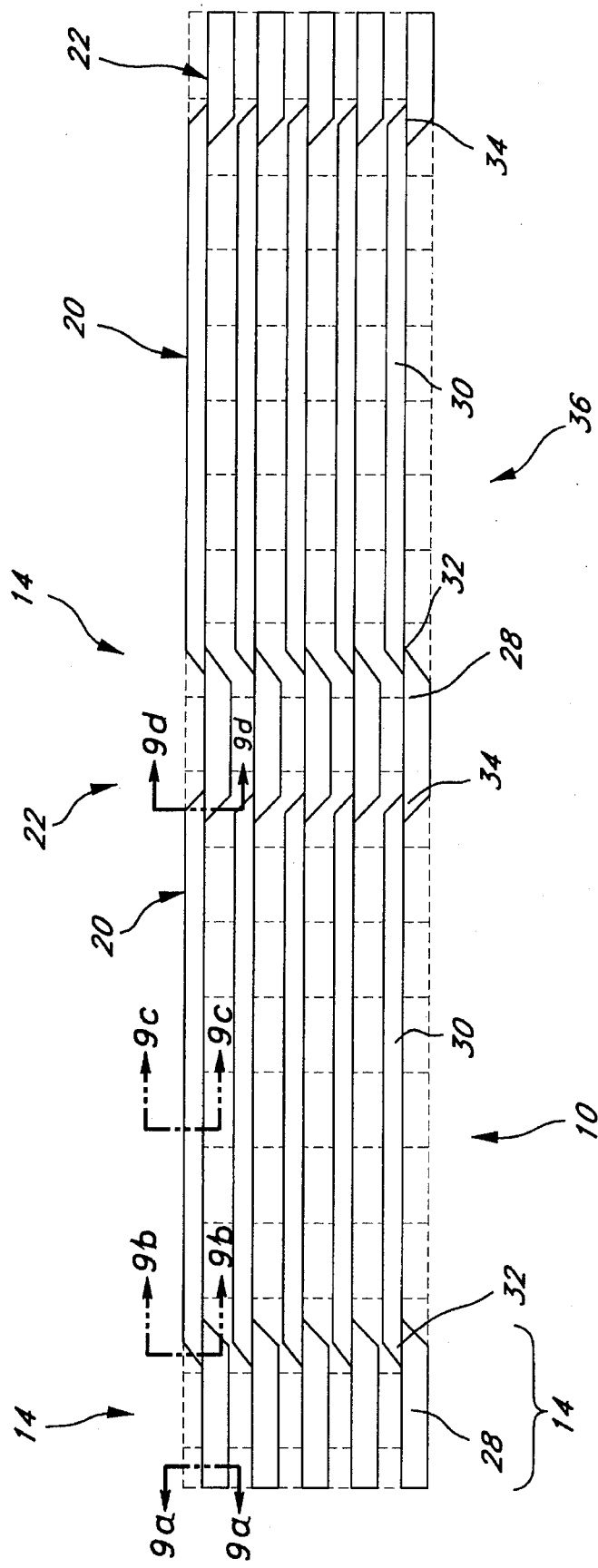
FIG. 8 is a top plan view of a preferred embodiment of a plurality of flat flexible jumpers of the present invention being formed from a continuous conductive strip.

As illustrated in FIG. 8, the jumper is manufactured such that first the proximal connection end 14 of the jumper 10 is formed. From a first portion of the preformed conductive strip 26, the first cutting die is utilized to selectively remove the conducting bands having the first cross-sectional area, i.e., the flat zone 30, which leaves the raised zone 28 remaining. The cross-sectional area of the resulting raised zone 28 with the surrounding flat zone 30 removed is illustrated in FIG. 9a. The first cutting die is, repeatedly, stamped as the continuous conductive strip 26 is moved a distance equivalent to the length of the die until the desired length of the proximal connection end 14 has been completed. FIG. 8 also illustrates in phantom line the material which is removed with each stamping of the die to achieve the desired length of the proximal termination end 14. For example, if a jumper is desired to have a proximal connection end 14 of 1.0 inches in length and the first cutting die is 0.1 inches long, the first die is stamped to remove the flat zone 30 of the conductive strip 26. Then the continuous conductive strip 26 is incremental moved 0.1 inches, then the die is stamped, then the strip 26 is moved 0.1 inches for a total of ten repetition of the cutting and moving processes to complete the formation of the 1.0 inch proximal connection end 14.

Secondly, as illustrated in FIG. 8, a first transition region 32 between the raised zone 28 and the flat zone 30 of the conductive strip 26 is formed. From a second portion of the preformed conductive strip 26, the second cutting die is utilized to simultaneously remove a portion of the conducting bands having the first cross-sectional area, i.e., the raised zone 28, and a portion of the conducting bands having the second cross-sectional area, i.e., the flat zone 30, to form the first transition region 32 between the raised zone 28 and the flat zone 30 of the conductive strip 26. The second cutting die leaves a portion of the raised zone 28 and the flat zone 30, as illustrated in the cross-sectional view of FIG. 9b. The second cutting die is stamped to form the first transition region 32 and the length of the conductive strip is moved the length of the die. Since the transition region 32 is usually of a small length and is not a parameter which is defined by the user, a single die is typically created to stamp the entire first transition zone 32 in a single cutting process and does not require the repetition that the other regions require. FIG. 8 illustrates in phantom line the material which is removed from the raised zone 28 and the flat zone 30 with the stamping of the die to form the first transition zone 32.

Thirdly, as illustrated in FIG. 8, the flat flexible central zone 20 of the jumper 10 is formed. From a third portion of the preformed conductive strip 26, the third cutting die is utilized to selectively remove the conducting bands having the second cross-sectional area, i.e., the raised zone 28, which leaves the flat zone 30 remaining. The cross-sectional area of the resulting flat zone 30 with the surrounding raised zone 28 removed is illustrated in FIG. 9c. The third cutting die is repeatedly stamped and the conductive strip 26 is moved the length of the die. The die is repeatedly stamped and the conductive strip 26 is repeatedly moved until the desired length of the flat zone 30 has been completed. FIG. 8 illustrates in phantom line the material which is removed from the raised zone 28 with each stamp of the die to form the desired length of the central flat flexible portion 20. For example, if a jumper 10 is desired to have a flat central zone 20 of 10.0 inches in length and the third cutting die is 0.5 inches long, the third die is stamped to remove the raised zone 28 from the conductive strip 26 then the continuous conductive strip 26 is incremental moved 0.5 inches. The die is repeatedly stamped, and the strip is moved 0.5 inches for a total of twenty repetitions of the cutting and moving processes to complete the formation of the 10.0 inch flat flexible central zone 20.

Fourthly, as illustrated in FIG. 8, a second transition region 34 between the flat zone 30 and the raised connection zone 28 of the conductive strip 26 is formed. From a fourth portion of the preformed conductive strip 26, the fourth cutting die is utilized to simultaneously remove a portion of the conducting bands having the first cross-sectional area, i.e., the raised zone 28, and a portion of the conducting bands having the second cross-sectional area, i.e., the flat zone 30, to form the second transition region 34 between the raised zone 28 and the flat zone 30 of the conductive strip 26. The fourth cutting die when forming the second transition region 34 leaves a portion of the flat zone 30 and the raised zone 28, as illustrated in the cross-sectional view of FIG. 9d, and is a mirror image of the first transition region 32 illustrated in FIG. 9b. The fourth cutting die is stamped and the continuous conductive strip 26 is moved the length of the die to form the second transition region 34. Since the second transition region 34, like the first transition region 32, is usually of a small length and is not a parameter which is defined by the user, a single die is also created to stamp the entire second transition zone 34 in a single cutting process and does not require the repetition that the other regions require. FIG. 8 illustrates in phantom line the material which is removed from the raised zone 28 and the flat zone 30 with the stamping of the die to form the second transition zone 34.

Lastly, as illustrated in FIG. 8, the distal connection portion 22 of the jumper 10 is formed. From a fifth portion of the preformed conductive strip 26, the first cutting die is once again utilized to selectively remove the conducting bands having the first cross-sectional area, i.e., the flat zone 30, which leaves the raised zone 28 remaining. The first cutting die is repeatedly stamped and the continuous conductive strip 26 is moved the length of the die. The stamping of the die and the incremental movement of the continuous cutting strip is repeated until the length of the distal connection end 22 of the jumper 10 has been completed. In this embodiment, the cross-sectional area of the resulting raised zone 28 with the surrounding flat zone 30 removed is identical to the cross-section of the distal end 14 illustrated in FIG. 9a. Additionally, the proximal and distal connection ends 14, 22 of the jumper 10 in this embodiment are of identical lengths, since they are connecting similar items. However, utilizing the method of the present invention, the proximal end 14 and the distal connection end 22 of the jumper 10 are individually formed, so the proximal end 14 and the distal connection end 22 of the jumper 10 may have different lengths or configurations. FIG. 8 illustrates in phantom line the material which is removed with each stamping of the die to achieve the desired length of the distal termination end 22.

For example, if it is desirous to have a proximal connection end 14 of the jumper 10 with a 1.0 inch length as in the above example and a distal connection end 22 of the jumper 10 with a 0.5 inch length, after the formation of the second transition zone 34, the first cutting die which is 0.1 inches long is stamped to remove the flat zone 30 of the conductive strip 26 then the continuous conductive strip 26 is incremental moved 0.1 inches. The strip 26 is again stamped with the die and the continuous conductive strip 26 is moved 0.1 inches. The repetitions of the cutting and moving processes are repeated five times to complete the formation of the 0.5 inch distal connection end 22 of the jumper 10.

The stamping process is designed such that a series of jumpers 10 can be formed along the length of the continuous conductive strip 26 utilizing the process described above as illustrated in FIG. 8. In order to form a series of jumpers 10 on the conductive strip 26, after the distal end 22 of a first jumper 10 is created, the proximal end 14 of a second jumper 36 is created, this processes is continued until the entire length of the continuous conductive strip 26 has been utilized to form the maximum amount of complete jumpers possible. The continuous strip of jumpers can be separated into individual jumpers by an additional cutting process.

The above examples are considered in all respects only as illustrative and not restrictive. As will be recognized by one of skill in the art, the four manufacturing steps may be repeated any number of times to achieve the desired configuration of the jumper. Further, the size and shape of the cutting dies can be varied for different embodiments of the jumper.

In a preferred embodiment, a progressive die stamping machine is utilized to execute the above cutting process in a repetitious manner to increase the number of jumpers that can be created in a short time period over a manual manufacturing method where each die is individually hand stamped. A progressive die stamping machine comprises a single programmable die which is divided into a number of die sections. Each die section is independently controlled by a main computer system to be in either an idle or operational state. As the continuous conductive strip is fed through the progressive die machine, one section of the die is operational and cuts the strip while the remainder of the dies sections remains in an idle mode. After the die section has been stamped, the continuous conductive strip is moved a length equivalent to the length of the previously operational die section. The stamping process is repeated with one of the die sections being operational and the other die sections remaining in an idle state. This process continuous until a number of jumpers have been completed along the continuous conductive strip 26.

Advantageously, the manufacturing process of the present invention enables a jumper of any configuration to be formed by a repetitive series of cutting operations. For example, this method of manufacturing can be used to make a jumper one mile long, as long as a preformed conductive strip 26 can be formed of that length. In another example, a jumper with a 0.01 inch proximal and distal connection ends 14,22 and a 0.03 inch central flat flexible portion 20, with each die section having a 0.01 inch length.

Figure 10:
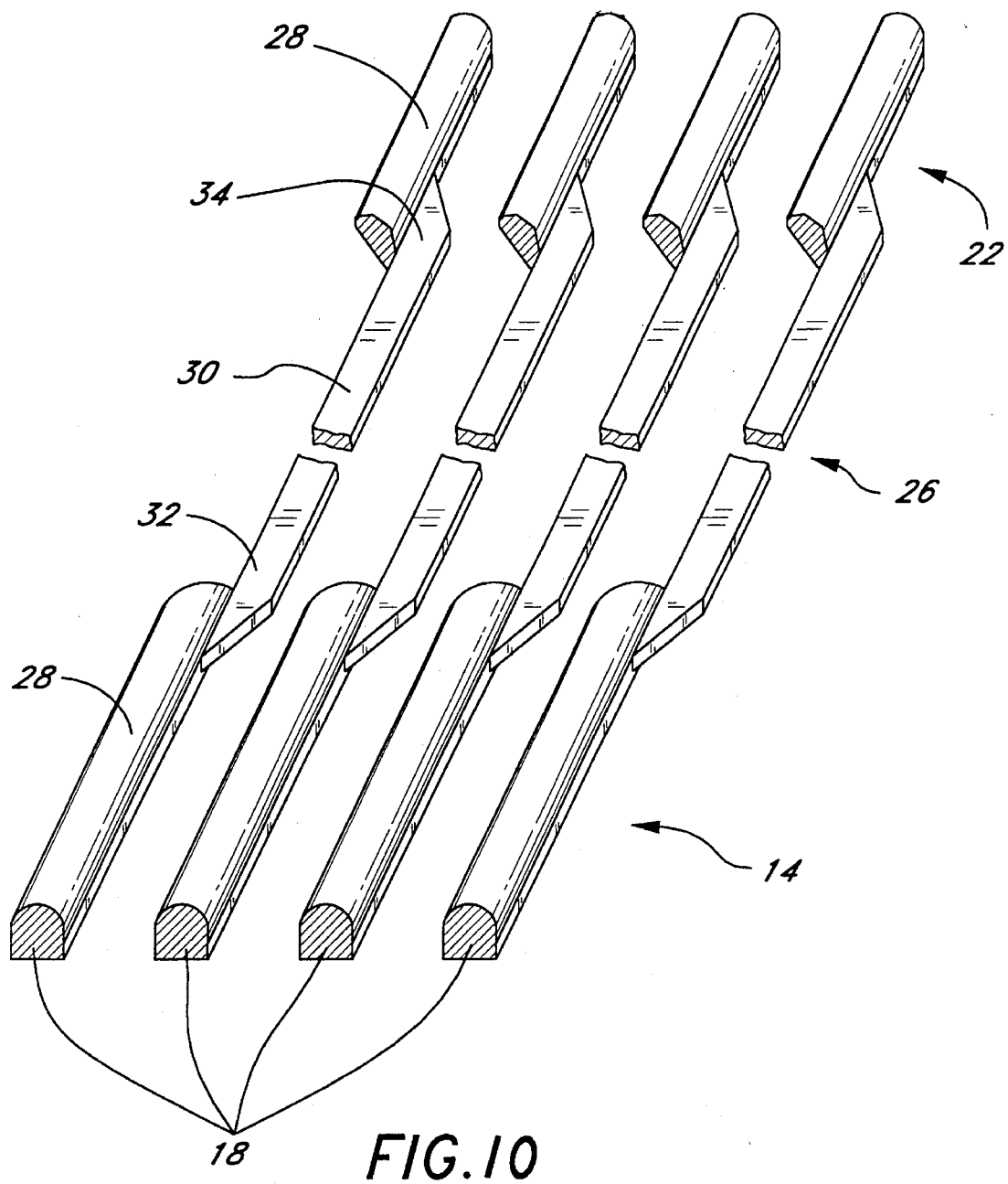
FIG. 10 is a perspective view of an uncompleted jumper illustrating the preformed conductive strip after the cutting step has been completed.

FIG. 10 illustrates a jumper 10 which has completed the above described cutting process. The cutting process transforms a continuous strip of conductive material 26 into plurality of independently formed conductors. Each conductor is individually comprised of its own distal and proximal connection ends and a central flat flexible zone. Further, as is shown in FIG. 10 a first proximal termination end 14 including plural conductor terminations in a parallel, side-by-side array is connected to and each entirely laterally offset from a central flat flexible portion 20 including plural, parallel, spaced, flexible conductors. Further, a second distal termination end 22 including plural conductor terminations in a parallel, side-by-side array is connected to and laterally offset from the flat flexible conductors of the flat flexible portion 20, the terminations of the first and second termination ends 14, 22 being laterally aligned with each other.

At this point, the independently formed conductors are covered by insulation 12 to prevent undesired contact between each of the individual conductors and to form the unitary bonded element which forms a single jumper 10. Any number of conventional insulation application methods may be used, such as extruding the insulation or laminating.

If the extrusion technique is utilized, the jumper 10 is extruded through conventional extrusion machine (not illustrated) with insulation material 12 surrounding all portions of the jumper 12. After extrusion, the insulation 12 is stripped from the proximal end 14 and the distal end 22 of each jumper 10 to expose the electrical connection points 18. Since the extrusion process requires two steps, the lamination process is often preferred.

In the lamination process, as illustrated in FIG. 2, the flat flexible central zone 20 of the jumper 10 is covered with first 38 and second 40 layers of an insulation material. The first layer 38 of insulation 12 covers a top surface of the flat flexible central zone 20 of the jumper 10. The second layer 40 of insulation 12 covers a bottom surface of the flat central zone 20 of the jumper 10. The first and second layers 38, 40 of insulation 12 covering the flat central zone 20 of the jumper 10 is subject to heat and pressure as is typical in a lamination process to force the insulation 12 into the areas in between each of the conductors in the flat central zone 20 of jumper 10. The lamination process does not require the stripping step that is required by the extrusion method, since the first and second layers 38, 40 of insulation are not placed over the proximal and distal connection ends 14, 22 of the jumper 10.

Advantageously, the stamping process preformed on the preformed conductive strip provides a simple manufacturing process which can adapt to any number of jumper configurations without requiring expensive retooling operations. In addition, the manufacturing process provides a manufacturing method which provides independent parameters for the cross-sectional area of the connection zone and the flat flexible central zone. Further, the distance between the centers of each of the connection points, also referred to as the pitch, is independent of the size of the flat central zone. Therefore, the preferred manufacturing process enables a jumper of any number of different sizing parameters to be formed, since the size of the raised connection zone and the flat zone are independent of each other, as is the desired pitch of the connection points.

Lastly, the preferred manufacturing process removes the unwanted material from the preformed strip when forming the jumper without changing the mechanical properties of the metal, such as the tensile strength, hardness, elongation and flexibility of the material, that remains to form the jumper.

The present invention may be embodied in other specific forms without departing from its spirit or essential characteristics. The described embodiments are to be considered in all respects only as illustrative and not restrictive. The scope of the invention is, therefore, indicated by the appended claims rather than the foregoing description. All changes which come within the meaning and range of equivalency of the claims are to be embraced within their scope.

What is claimed:

1. A method of forming an electrical jumper, wherein said jumper comprises a series of individual, flexible, parallel conductors partially contained within an insulation material, comprising the steps of:

constructing a preformed conductive strip, wherein said strip comprises alternating conducting bands having first and second cross-sectional areas;

selectively removing said conducting bands having said first cross-section in a first length of said preformed conductive strip to form a first termination of said jumper;

selectively removing said conducting bands having said second cross-section in a second length of said preformed conductive strip to form a flexible conductive portion of said jumper; and selectively removing said conducting bands having said first cross-section in a third length of said preformed conductive strip to form a second termination of said jumper.

2. The method of forming an electrical jumper, as defined by claim 1, additionally comprising the steps of:

simultaneously removing a portion of said conducting bands having said first cross-section and a portion of said conducting bands having said second cross-section in a fourth length of said preformed conductive strip between said first length and said second length; and simultaneously removing a portion of said conducting bands having said first cross-section and a portion of said bands having said second cross-section in a fifth length of said preformed conductive strip between said second length and said third length.

3. The method of forming an electrical jumper, as defined by claim 2, additionally comprising the step of:

covering the second, fourth and fifth lengths of said conductive strip with said insulation material.

* * * * *